(12) United States Patent
Chiu

(10) Patent No.: US 11,140,770 B2
(45) Date of Patent: Oct. 5, 2021

(54) PRINTED CIRCUIT BOARD ASSEMBLY

(71) Applicant: Intel Corporation, Santa Clara, CA (US)

(72) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 15/927,020

(22) Filed: Mar. 20, 2018

(65) Prior Publication Data
US 2019/0297724 A1 Sep. 26, 2019

(51) Int. Cl.
| | |
|---|---|
| *H05K 1/02* | (2006.01) |
| *H05K 1/18* | (2006.01) |
| *H05K 5/00* | (2006.01) |
| *H05K 1/11* | (2006.01) |
| *H01G 4/12* | (2006.01) |
| *H05K 3/30* | (2006.01) |

(52) U.S. Cl.
CPC ............. *H05K 1/0271* (2013.01); *H01G 4/12* (2013.01); *H05K 1/112* (2013.01); *H05K 1/181* (2013.01); *H05K 3/30* (2013.01); *H05K 5/0069* (2013.01); *H05K 2201/10015* (2013.01); *H05K 2201/2045* (2013.01)

(58) Field of Classification Search
CPC ... H05K 2201/0125; H05K 2201/0133; H05K 1/0393; H05K 1/144; H05K 2201/041; H05K 2201/042; H05K 2201/043; H05K 2201/045
USPC ....... 361/748, 750, 758, 760, 762, 770, 784, 361/785, 787, 790
See application file for complete search history.

(56) References Cited

U.S. PATENT DOCUMENTS

| | | | | |
|---|---|---|---|---|
| 4,974,119 | A * | 11/1990 | Martin | H05K 3/0061 165/185 |
| 8,922,988 | B2 * | 12/2014 | Swett | H05K 5/0213 361/679.36 |
| 2015/0070864 | A1 * | 3/2015 | Rainer | H01L 21/563 361/782 |

OTHER PUBLICATIONS

Bonicatto; "Reduce Acoustic Noise from Capacitors;" EDN Network; (Feb. 17, 2011); 2 pages; [retrieved on Jul. 18, 2019]; Retrieved from <URL: https://www.edn.com/design/components-and-packaging/4364020/Reduce-acoustic-noise-from-capacitors >.
Guibourg; "Reducing MLCCS' Piezoelectric Effects and Audible Noise;" EE News Analog; (Apr. 30, 2012); 2 pages; [retrieved on Jul. 18, 2019]; Retrieved from <URL: https://www.eenewsanalog.com/content/reducing-mlccs-piezoelectric-effects-and-audible-noise >.

* cited by examiner

*Primary Examiner* — Binh B Tran
(74) *Attorney, Agent, or Firm* — Schwabe, Williamson & Wyatt, P.C.

(57) ABSTRACT

Printed circuit board assembly (PCBA) technology is disclosed. A PCBA can include a printed circuit board (PCB). The PCBA can also include a capacitor operably mounted on a side of the PCB. In addition, the PCBA can include a damper material coupled to the PCB and operable to dissipate kinetic energy generated by the capacitor during operation. An electronic system including a capacitor and damping material, and a method for minimizing acoustic vibration in an electronic system are also disclosed.

17 Claims, 6 Drawing Sheets

PRINTED CIRCUIT BOARD ASSEMBLY

TECHNICAL FIELD

Embodiments described herein relate generally to printed circuit board assemblies (PCBAs), and more particularly to PCBAs that include capacitors.

BACKGROUND

Capacitors (e.g., multilayer ceramic capacitors (MLCCs)) are commonly used in power electronic designs. Due to the piezoelectric effect, capacitors may tend to deform while undergoing changes in voltage (e.g., during power switching), causing the capacitors to vibrate and generate an audible noise. As a result, such capacitors are known as "singing capacitors." When mounted on a printed circuit board (PCB), the noise gets amplified by the PCB, which results in an unpleasant buzzing sound that often negatively affects user experience. Several approaches have been implemented to address singing capacitors. One approach attempts to isolate a capacitor from the PCB with long lead wires that support the capacitor out of contact with the PCB. Another approach places capacitors on opposite sides of a PCB so that the vibrations of the capacitors cancel out. Yet another approach adds stiffeners to a PCB near a capacitor to increase PCB rigidity. An additional approach addresses the voltage delivered to a capacitor by slowing the slew rate, which affects the deformation of the capacitor and its ability to generate noise.

BRIEF DESCRIPTION OF THE DRAWINGS

Technology features and advantages will be apparent from the detailed description which follows, taken in conjunction with the accompanying drawings, which together illustrate, by way of example, various technology embodiments; and, wherein.

Figure 1:
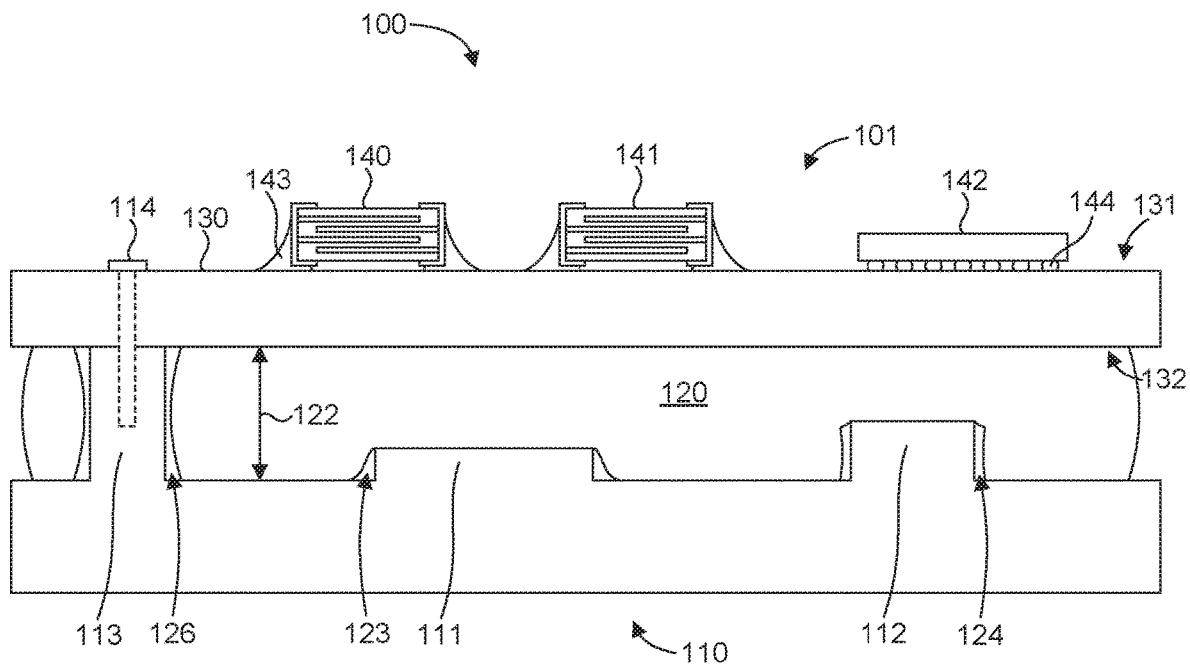
FIG. 1 illustrates a schematic cross-section of an electronic system in accordance with an example embodiment.

Reference will now be made to the exemplary embodiments illustrated, and specific language will be used herein to describe the same. It will nevertheless be understood that no limitation of the scope or to specific technology embodiments is thereby intended.

DESCRIPTION OF EMBODIMENTS

Before technology embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a capacitor" includes a plurality of such capacitors.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects or structures are in physical contact and are attached. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, comparative terms such as "increased," "decreased," "better," "worse," "higher," "lower," "enhanced," "minimized," "maximized," "increased," "reduced," and the like refer to a property of a device, component, function, or activity that is measurably different from other devices, components, or activities in a surrounding or adjacent area, in a single device or in multiple comparable devices, in a group or class, in multiple groups or classes, related or similar processes or functions, or as compared to the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Although previous attempts to mitigate the singing capacitor issue have been effective to varying degrees, they are not without drawbacks. With capacitors that incorporate long lead wires to support the capacitor out of contact with the PCB, the long lead wires significantly increase the Z-height of the capacitor and is therefore not a viable solution for applications with limited Z-height space (e.g., portable devices). These special capacitors are also generally more expensive than typical capacitors (such as a typical MLCC). Placing capacitors on opposite sides of a PCB requires a double-sided PCB design, which may not be desirable from a cost or packaging perspective. The addition of stiffeners to a PCB will occupy valuable PCB real estate and therefore may not be feasible on a crowded PCB. Finally, slowing the slew rate causes the power consumption to increase and therefore reduces battery life.

Accordingly, a printed circuit board assembly (PCBA) is disclosed that mitigates or eliminates the singing capacitor problem without the disadvantages of the prior approaches. In one aspect, vibrations generated by a capacitor can be dampened to reduce or prevent noise generation. In one example, a PCBA in accordance with the present disclosure can include a printed circuit board (PCB). The PCBA can also include a capacitor operably mounted on a side of the PCB. In addition, the PCBA can include a damper material coupled to the PCB and operable to dissipate kinetic energy generated by the capacitor during operation. An electronic system including a capacitor and damping material is also disclosed.

Figure 2:
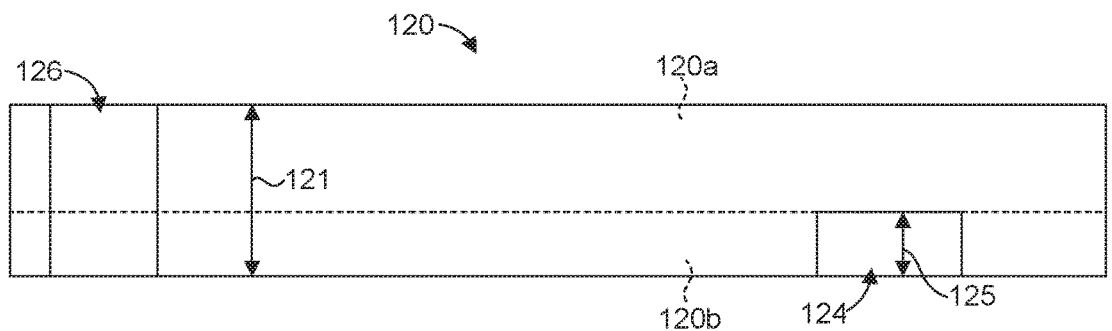
FIG. 2 illustrates a damper material of the electronic system of FIG. 1 shown isolated, in accordance with an example embodiment.

Referring to FIG. 1, an exemplary electronic system 100 is schematically illustrated in cross-section. In general, the electronic system 100 can include a PCBA 101 coupled to a component 110, and a damper material 120 disposed between and in contact with the component 110 and the PCBA 101. The damper material 120 is shown isolated in FIG. 2, which is referred to along with FIG. 1 in discussing various aspects of the present technology.

The PCBA 101 can include a PCB 130 and one or more electronic components 140-142 operably mounted on a side 131 of the PCB 130. An electronic component can be any electronic device or component that may be included on a circuit board, such as a passive electronic component (e.g., a resistor, a capacitor, an inductor, etc.) and an active electronic component (e.g., a semiconductor device (e.g., a die, a chip, a processor, computer memory device, platform controller hub, etc.), a transistor, a rectifier, etc.). In general, a passive electronic component has no function of gain or control over voltage or current and thus its controlling function is linear. An active electronic component, on the other hand, has a function of gain or control over voltage or current, meaning the connection of the controlling parameters is nonlinear.

In some embodiments, as illustrated in FIG. 1, the electronic components 140, 141 may represent capacitors and the electronic component 142 may represent a chip or a package. The capacitors 140, 141 can be any suitable type of capacitor having any suitable type of construction, such as a multilayer ceramic capacitor (MLCC). Although two capacitors 140, 141 are depicted in FIG. 1, any suitable number of capacitors can be included. The capacitors 140, 141 can be electrically coupled or mounted on the PCB 130 in any suitable manner, such as surface mounting with a solder material and/or a conductive adhesive 143 as an interconnect structure. The electronic component 142 may be, include, or be a part of a processor, memory, or application specific integrated circuit (ASIC) in some embodiments. Although one electronic component 142 is depicted in FIG. 1, any suitable number of electronic components can be included. The electronic component 142 can be attached to the PCB 130 according to a variety of suitable configurations including a flip-chip configuration, wire bonding, and the like. The electronic component 142 can be electrically coupled to the PCB 130 using interconnect structures 144 (e.g., the illustrated solder balls and/or wire bonds) configured to route electrical signals between the electronic component 142 and the PCB 130. In some embodiments, the interconnect structures 144 may be configured to route electrical signals such as, for example, I/O signals and/or power or ground signals associated with the operation of the electronic component 142.

The PCB 130 may include electrically conductive elements or electrical routing features (not shown) configured to route electrical signals to or from the electronic components 140-142. The electrical routing features may be internal (e.g., disposed at least partially within a thickness of the PCB 130) and/or external to the PCB 130. For example, in some embodiments, the PCB 130 may include electrical routing features such as pads, vias, and/or traces configured to receive the interconnect structures 143, 144 and route electrical signals to or from the electronic components 140-142. The pads, vias, and traces can be constructed of the same or similar electrically conductive materials, or of different electrically conductive materials. The PCB 130 can also be configured to couple with another PCB (e.g., a circuit board such as a motherboard) for power and/or signaling.

Figure 3:
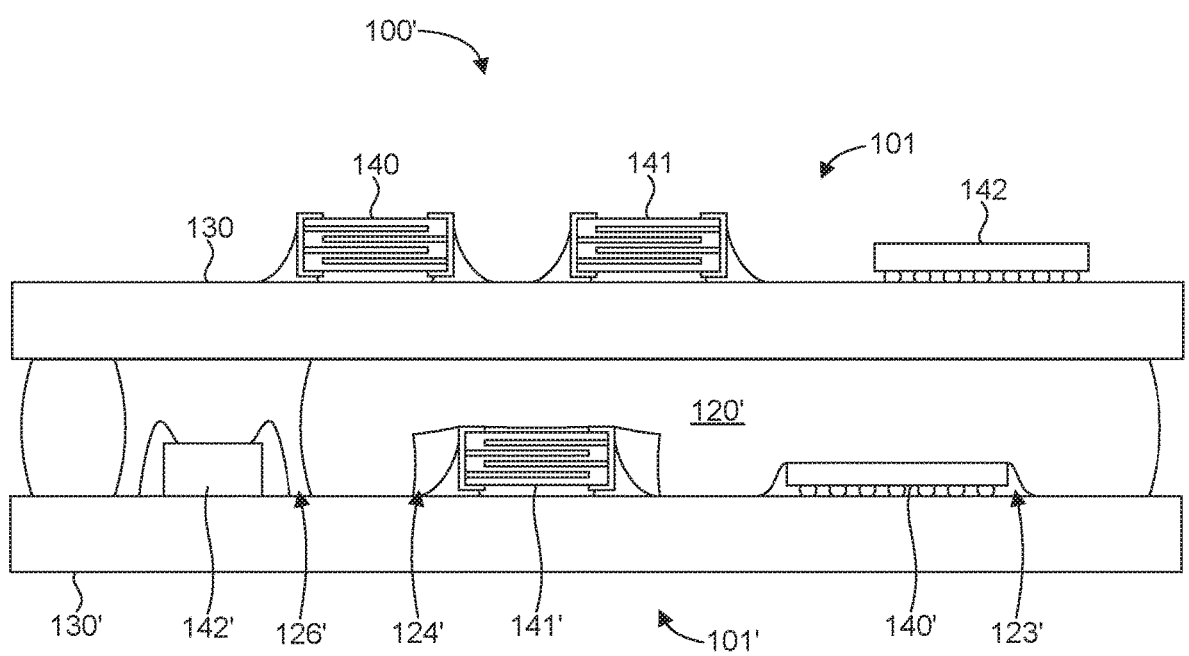
FIG. 3 illustrates a schematic cross-section of an electronic system in accordance with an example embodiment.

The component 110 can be a chassis (see FIG. 1), another PCBA (see FIG. 3), or other suitable structure to which the PCBA 101 may be mounted or attached. In the embodiment illustrated in FIG. 1, the component 110 is a chassis, which as used herein refers to any computer or electronic device structure typically known in the art as a case, cabinet, base, housing, etc. that serves as a mounting structure for electronic components or devices (e.g., PCBs or PCBAs). A chassis may be constructed of any suitable material, typically utilizing structural materials such as steel, aluminum, plastic, etc. FIG. 3 shows an electronic system 100' that is similar to the electronic system 100 but illustrates a damper material 120' disposed between the PCBA 101 and another PCBA 101'. The PCBAs 101, 101' may be mounted or attached to a chassis that is not shown in the figure.

As shown in FIG. 1, the PCBA 101 is adjacent and operably coupled to the component 110. The capacitors 140, 141 may have a tendency to vibrate during power switching, which can cause the PCB 130 to vibrate and generate an acoustic noise or vibration (e.g., a buzzing noise). To minimize or eliminate audible noise generated by the capacitors 140, 141, the damper material 120 can be disposed between and in contact with the PCB 130 and the component 110 to passively absorb and damp vibration. The damper material 120 can be operable to limit deflection of the PCB 130 and attenuate resonance and therefore dissipate (i.e., dampen or absorb) kinetic energy generated by the capacitors 140, 141 during operation, which can reduce the vibration level which is transmitted at the natural frequency and thereby reduce or avoid the generation of audible noise by the capacitors 140, 141.

The damper material 120 can comprise any suitable elastomeric material. In one embodiment, the damper material 120 comprises a silicone-based polymer (e.g., polydimethylsiloxane (PDMS), which belongs to a group of polymeric organosilicon compounds that are commonly referred to as silicones). In some embodiments, the damper material 120 can comprise a high-damping elastomeric material, which can provide damping levels of approximately 10% of critical. Because the damper material 120 may be in a thermal path for cooling the electronic components 140-142 and because the damping material 120 dissipates energy by converting it to heat, the damper material 120 can be thermally conductive to facilitate cooling of the electronic components 140-142 and the damper material 120. For example, the damper material 120 can have a thermal conductivity greater than or equal to 3 W/(m·K). Such materials may be referred to as thermal elastomers, thermally conductive elastomers, or thermal pads. In addition, the damper material 120 can be non-electrically conductive or electrically insulative (e.g., having an electrical resistivity greater than or equal to $10^9$ Ohm·cm) to avoid electrically shorting the PCB 130 circuitry and/or the electronic components 140-142. The damper material 120 can comprise any suitable filler material known in the art to provide thermally conductive and/or electrically insulative properties for the damper material 120, such as boron nitride, aluminum nitride, alumina, magnesia, beryllium oxide, silicon carbide, copper, gold, etc. Typically, the proportion of filler in the damper material 120 may be from 60-85 wt %. Multiple particle sizes (e.g., from 5 µm to 250 µm) and shapes (e.g., irregular shaped, spherical, etc.) may be mixed to achieve the maximum packing density, resulting in a high-density thermal elastomer. In one aspect, the damper material 120 can have a mass density greater than or equal to 2.8 g/cm³. In another aspect, the damper material 120 can have a hardness of 30-60 (Shore 00). Suitable damper materials include without limitation, PC and TG series thermal elastomers from T-Global, Tflex™ from Laird, THERM-A-GAP™ from Chomerics and Gap Pad® from Bergquist. A few examples of such materials are provided in the table below.

| Name | Company | Available thickness (mm) | Thermal conductivity (W/m-K) | Electrical Resistivity (Ohm-cm) | Density (g/cm$^3$) | Hardness (Shore 00) |
| --- | --- | --- | --- | --- | --- | --- |
| PC94 | T-Global | 0.25-5.0 | 4 | $10^{10}$ | 2.5 | 60 |
| TG-X | T-Global | 0.5-1.0 | 12 | $10^{11}$ | 3.4 | 60 |
| TG6050 | T-Global | 0.5-2.0 | 6 | $10^{12}$ | 3.2 | 50 |
| TG4040 | T-Global | 0.5-5.0 | 4 | $10^{12}$ | 2.8 | 40 |
| Tflex™ P300 | Laird | 0.5-5 | 3 | $2 \times 10^{14}$ | 3.1 | 30 |
| THERMA-A-GAP™ 580 | Chomerics | 0.5-5 | 3 | $10^{14}$ | 2.9 | 45 |
| THERMA-A-GAP™ 579 | Chomerics | 0.25-5 | 3 | $10^{14}$ | 2.9 | 30 |
| Gap Pad® HC 3.0 | Bergquist | 0.5-3.2 | 3 | $10^{10}$ | 3.1 | 15 |
| Gap Pad® HC 5.0 | Bergquist | 0.1-3.2 | 5 | $10^{10}$ | 3.2 | 35 |
| Gap Pad® 5000S35 | Bergquist | 0.5-3.2 | 5 | $10^{9}$ | 3.6 | 35 |
| Gap Pad® 3500ULM | Bergquist | 0.5-3.2 | 3.5 | $10^{10}$ | 3.1 | 35 |

The "low modulus" property typical of elastomers and the high mass density due to highly loaded thermally conductive fillers can enable the damper material 120 to provide the damping effect needed to reduce the vibration of the PCB 130. The buzzing noise that may be generated from the capacitors 140, 141 during power switching can therefore be minimized, while the absorbed vibration energy and/or the joule heating from the PCB 130 can be dissipated to environmental ambient through the damper material 120.

As illustrated in FIG. 1, the damper material 120 can be disposed between the component 110 and the PCB 130, for example, on a back side 132 opposite the top side 131 on which the electronic components 140-142 are mounted. This "sandwich" of the damper material 120 can provide a type of constrained layer damping (CLD) system where energy is dissipated as a result of shear deformation of the damper material 120. In one aspect, the damper material 120 can be compressed between the component 110 and the PCB 130 to ensure good contact with the PCB 130 and the component 110 and to support and stabilize the PCB 130 thereby damping and reducing vibration. To this end, the damper material 120 can be compressed at least 10% of an uncompressed thickness 121 (FIG. 2) of the damper material 120. In other words, a final gap or spacing 122 between the component 110 and the PCB 130 and the uncompressed thickness 121 can be such that the damper material 120 is compressed at least 10% of the uncompressed thickness 121. In some embodiments, the damper material 120 can be compressed at most 30% (20% in some embodiments) of the uncompressed thickness 121 of the damper material 120 to avoid generating excessive mechanical stress in the system. Although the embodiment shown in FIG. 1 represents a single-sided PCB platform (e.g., the electronic components 140-142 are all located on the same (e.g., top) side 131 of the PCB, it should be recognized that one or more electronic components can be located on the opposite or back side 132 of the PCB 130.

Due to the conformal property of an elastomeric material, the damper material 120 will typically conform to relatively small protrusions, features, or non-flat surfaces on an underside 132 of the PCB 130 and the component 110 to fill in a gap or space between the PCB 130 and the component 110. For example, as shown in FIG. 1, the damper material 120 may locally deform at 123 about a protruding surface feature on the component 110, such as a rib 111 or other structural reinforcing feature of the component 110. Similarly, as shown in FIG. 3, the damper material 120' may locally deform at 123' about an electronic component 140' of the PCBA 101'. Thus, if a surface feature (e.g., electrical components and/or chassis features) does not protrude too much (e.g., such that local compression of the damper material 120 would not exceed an allowable limit, such as 30%), then a damper material 120 with uniform thickness can be used and will conform to the surface feature. On the other hand, if a protruding surface feature is too tall (e.g., would cause local compression of the damper material 120 to exceed an allowable limit, such as 30%), then a damper material 120 can be configured to accommodate it, such as by providing an opening or void in the damper material 120 to receive at least a portion of the protrusion. For example, as shown in FIG. 1, a surface feature on the component 110, such as a rib 112 or other structural reinforcing feature of the component 110 may protrude to an extent that would locally deform the damper material 120 beyond an allowable limit, such as more than 30% compression. Similarly, as shown in FIG. 3, an electronic component 141' may protrude to an extent that would locally deform the damper material 120' beyond an allowable limit. In this case, an opening configured as a blind recess 124, 124' can be formed in the damper material 120, 120' to accommodate the rib 112 or the electronic component 141'. A depth 125 of the recess 124 can be such that the damper material 120 compresses at least 10% locally between the rib 112 and the PCB 130. In some embodiments, the recess 124 can be configured to provide less than 10% compression locally between the rib 112 and the PCB 130, such as no compression by ensuring clearance between the rib 112 and the damper material 120. The damper material 120 can therefore be locally thinned to accommodate and cover a protruding surface feature without any local compression or without excessive local compression. The component 110 can include a mounting feature or stud 113 that is configured to interface with the PCB 130. In this case, an opening configured as a through hole 126 can be formed in the damper material 120 to accommodate the mounting stud 113. A through hole opening 126' can also be formed in the damper material 120', as shown in FIG. 3, to accommodate an electronic component 142', which may be relatively tall and/or include interface features (e.g., wire bonds) that may be too fragile to contact the damper material 120'.

Since the damper material 120 may be thermally conductive, it can help dissipate heat from the PCB 130 joule heating and/or heat from other hot components, such that the electronic components 140-142 will not exceed their operating temperature limit and maintain solder joint reliability. In one aspect, the damper material 120 can provide improved thermal performance over an air gap that would otherwise exist in the space between the PCB 130 and the component 110. The damper material 120 can also be electrically nonconductive to avoid a potential electrical short of any electronic component 140-142 and/or the PCB 130. In addition to providing structural damping, the damper material 120 can also serve as a sound barrier.

The damper material 120 can be coupled to the PCB 130 and/or the component 110 in any suitable manner, such as with an adhesive, a fastener (e.g., a bolt, screw, rivet, etc.), or other coupling device sufficient to maintain the damper material 120 in place relative to the PCB 130 and/or the component 110. In some embodiments, the PCB 130 can be coupled to the component 110 by a fastener 114 secured to the mounting feature or stud 113. In this case, the fastener 114 can also serve to couple the damper material 120 to the PCB 130 and the component 110. In some embodiments, the PCBA 101 can be provided with the damper material 120 coupled to the PCB 130 prior to installation, such as with an adhesive, a fastener, etc.

In some embodiments, the damper material 120 can have a sheet configuration. Typical sheet thicknesses can range from 2-5 mm although other thicknesses are possible. In one aspect, the damper material 120 can comprise multiple sheets stacked together to achieve a desired thickness 121. In this case, openings can be formed in one or more sheets but not in others. For example, a through hole may be formed in a sheet 120a that is next to a sheet 120b without a corresponding opening, which together form the blind hole 124. Multiple layers or sheets may be coupled to one another in any suitable manner, such as with an adhesive, a fastener (e.g., a bolt, screw, rivet, etc.), or other suitable coupling device. In some embodiments, where the PCB 130 is coupled to the component 110 by a fastener 114 secured to the mounting feature or stud 113, the fastener 114 can serve to couple layers or sheets of the damper material 120 to one another, as well as couple the damper material 120 to the PCB 130 and the component 110.

Figure 4A:
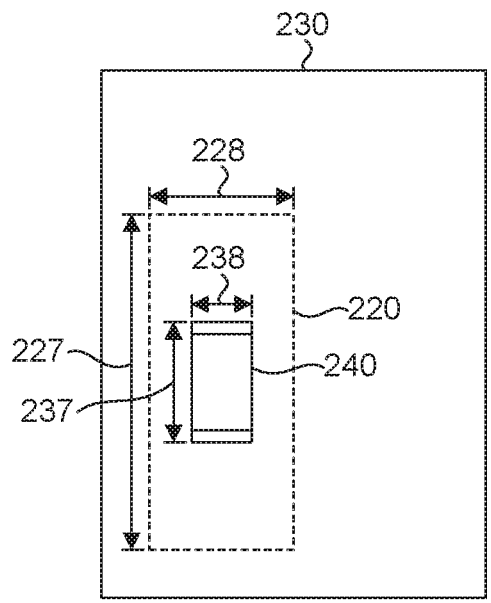
FIGS. 4A-4D illustrate top views of several examples of size and positional relationships for a capacitor, a PCB, and a damper material of an electronic system.
Figure 4B:
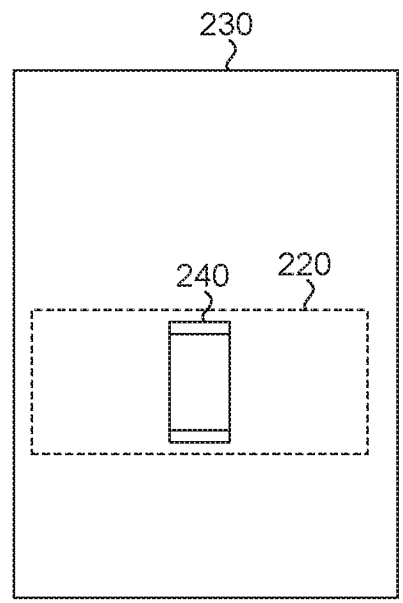
Figure 4C:
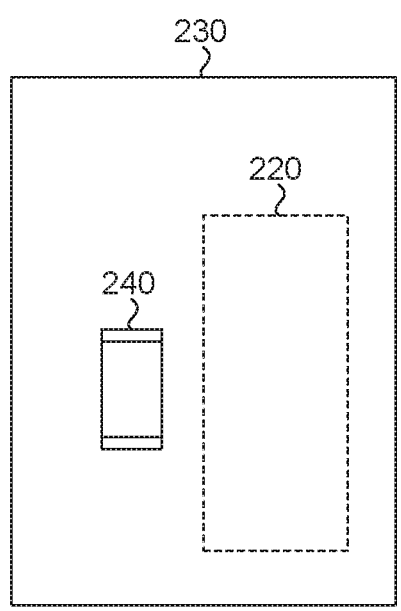
Figure 4D:
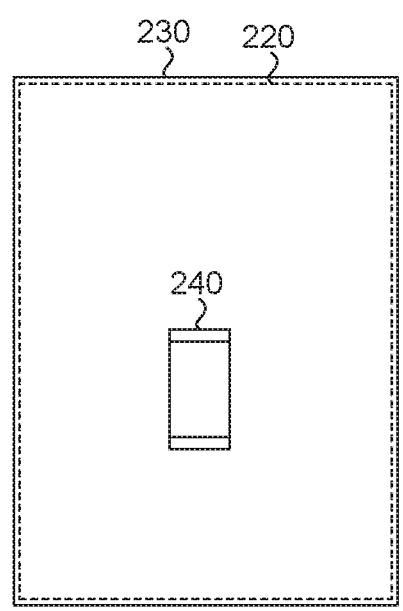

The damper material can be in any suitable location relative to the capacitors and the PCB. FIGS. 4A-4D illustrate top views of several examples of size and positional relationships for a capacitor 240, a PCB 230, and a damper material 220. In these examples, the capacitor 240 is located on a top side of the PCB 230, and the damper material 220 is located on a bottom side of the PCB 230. As shown in FIGS. 4A-4C, the damper material 220 can cover only a portion of the PCB 230. In FIGS. 4A and 4B, the damper material 220 can cover at least an area of the PCB 230 directly opposite or underneath the location of the capacitor 240 to damp the local PCB 230 vibration caused by the capacitor 240. This configuration can target vibration isolation where it is most needed, which can save money and weight. Although the damper material 220 can have any suitable shape or geometric configuration, superior noise reduction results may be achieved by selecting a rectangular shape for the damper material 220 that corresponds to a rectangular shape of the capacitor 240 and orienting the long dimension of the damper material 220 in the direction of vibrations generated by the piezoelectric effect of the capacitor 240. For example, the damper material 220 can be oriented such that a length 227 (i.e., long dimension) of the damper material 220 is aligned with or parallel to a length 237 of the capacitor 230, and a width 228 (i.e., short dimension) of the damper material 220 is aligned with or parallel to a width 238 of the capacitor 230, as shown in FIG. 4A. In addition to this configuration, in general, the greater the area covered by the damper material 220, the greater the noise reduction performance. As shown in FIG. 4D, the damper material 220 can cover substantially all of the PCB 230, although weight and cost considerations may dictate otherwise. Best results are typically achieved when the damper material 220 covers at least the area of the PCB 230 under or opposite the capacitor 240, which can provide significant noise reduction without 100% coverage of the PCB 230 by the damper material 220. When properly used, the damper material 220 can be as cost effective as it is acoustically effective.

Figure 5:
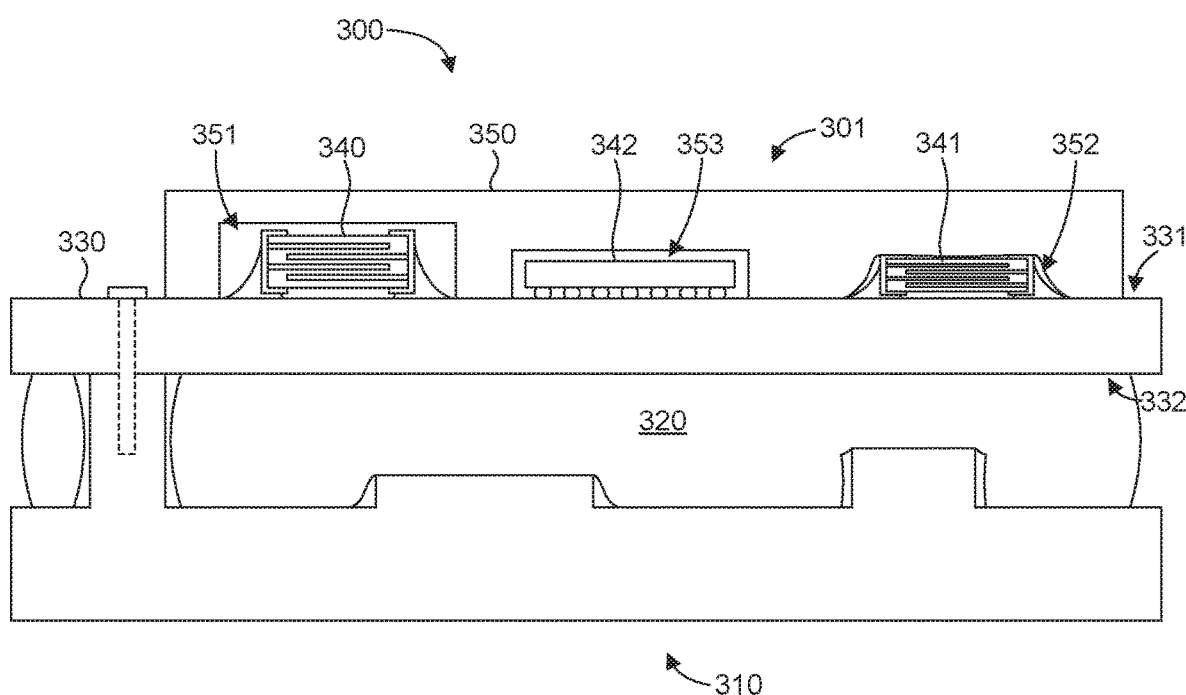
FIG. 5 illustrates a schematic cross-section of an electronic system in accordance with an example embodiment.

FIG. 5 illustrates an electronic system 300 in accordance with another example of the present disclosure. The electronic system 300 is similar to the electronic system 100 of FIG. 1 described above, but also includes an acoustic shield or insulation 350 disposed about at least a portion of one or both capacitors 340, 341 mounted on a PCB 330. The acoustic shield 350 can be configured to block sound propagation from one or both of the capacitors 340, 341 from a top side 331 of the PCB 330 in the event that noise is generated despite the presence of a damper material 320 on a bottom side 332 of the PCB 330 between the PCB 330 and a component 310 (e.g., a chassis). For example, the acoustic shield 350 can include openings or cavities 351, 352 (e.g., blind recesses) that may receive (e.g., surround) at least a portion of the respective capacitors 340, 341 so that the acoustic shield 350 can cover the capacitors 340, 341 and provide a physical barrier to mechanically block sound propagation.

In one aspect, the acoustic shield 350 can be configured as a damping mechanism, which can be provided in addition to that of the damper material 320. For example, the acoustic shield 350 can be made of an elastomeric material as described herein for use as a damper material. The acoustic shield 350 can be disposed on or otherwise coupled to the PCB 330 to provide a free-layer damping (FLD) system where energy is dissipated as a result of extension and compression of the elastomeric material of the acoustic shield 350 under flexural stress from the PCB 330. The acoustic shield 350 can be coupled to the PCB 330 in any suitable manner, such as with an adhesive or a fastener (e.g., a bolt, a screw, a rivet, etc.) in any combination. In some embodiments, a PCBA 301 can be provided with the acoustic shield 350 coupled to the PCB 330 prior to installation, such as with an adhesive, a fastener, etc.

The acoustic shield 350 can also include an opening 353 to receive at least a portion of an electronic component 342 that is mounted on the PCB 330. The opening 353 can be configured as a blind recess (as shown) or as a through hole that exposes the electronic component 342 through the acoustic shield 350. In one aspect, the openings 351, 353 can be pre-formed and configured to surround the capacitor 340 and the electronic component 342 without contacting these components. In another aspect, the opening 352 may be formed upon disposing the acoustic shield 350 over the capacitor 341 by the local deformation of the elastomeric material about the capacitor 341. Thermally conductive properties of the elastomeric material of the acoustic shield 350 can facilitate heat transfer from the capacitors 340, 341 and the electronic component 342. Electrically insulative properties can avoid electrically shorting circuitry on the PCB 330, the capacitors 340, 341, and/or the electronic component 342.

Figure 6:
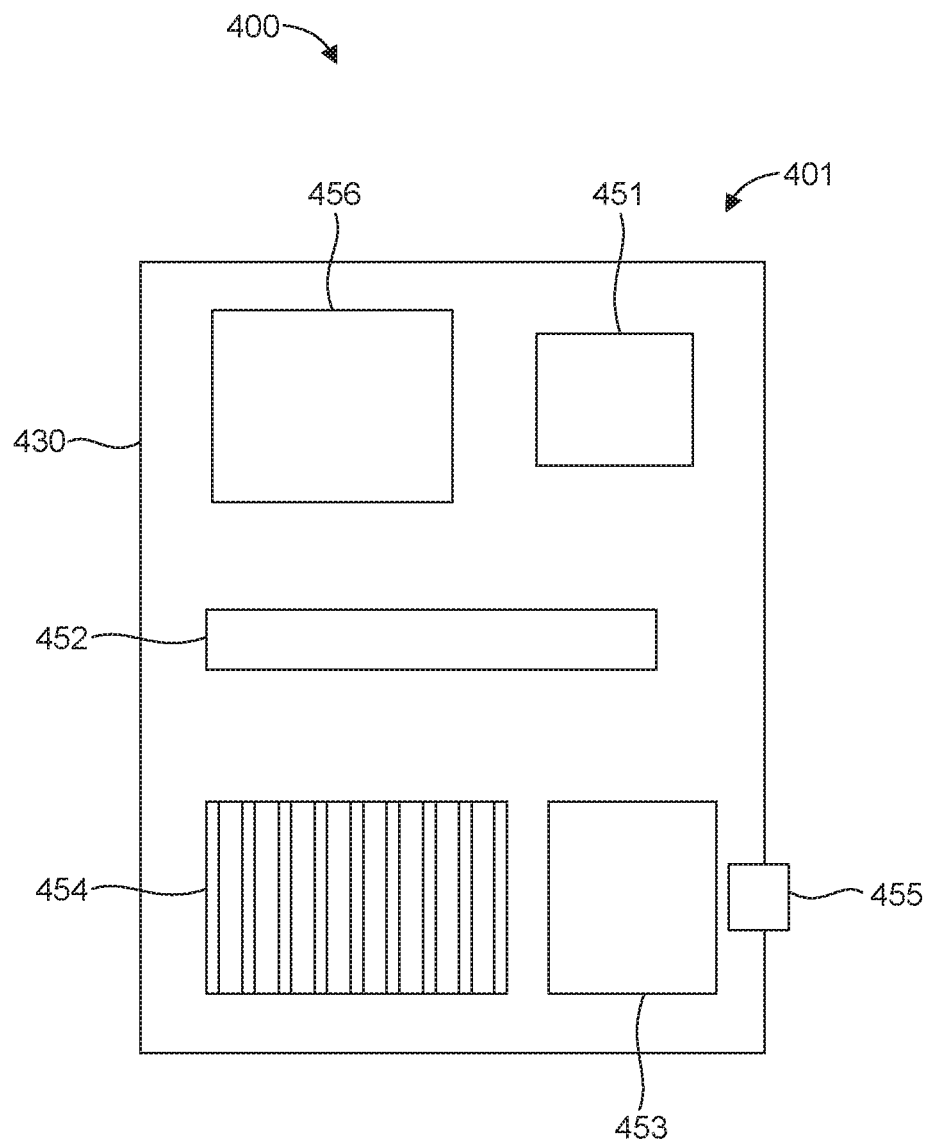
FIG. 6 is a schematic illustration of an exemplary electronic system.

FIG. 6 illustrates a schematic representation of an electronic system 400. The electronic system 400 can include a PCBA 401 coupled to a component (not shown) as disclosed herein, such as a chassis or another PCBA (e.g., a motherboard). In one aspect, the electronic system 400 can also include a processor 451, a memory device 452, a radio 453, a heat sink 454, a port 455, a slot, an electronic device package 456, or any other suitable device or component, which can be operably coupled to or associated with the PCBA 401 (e.g., mounted on a PCB 430 of the PCBA 401). The electronic system 400 can comprise any type of electronic system, such as a computing system (e.g., a desktop computer, a laptop computer, a tablet computer, a smartphone, a wearable device, a server, etc.). Other embodiments need not include all of the features specified in FIG. 6, and may include alternative features not specified in FIG. 6.

Figure 7:
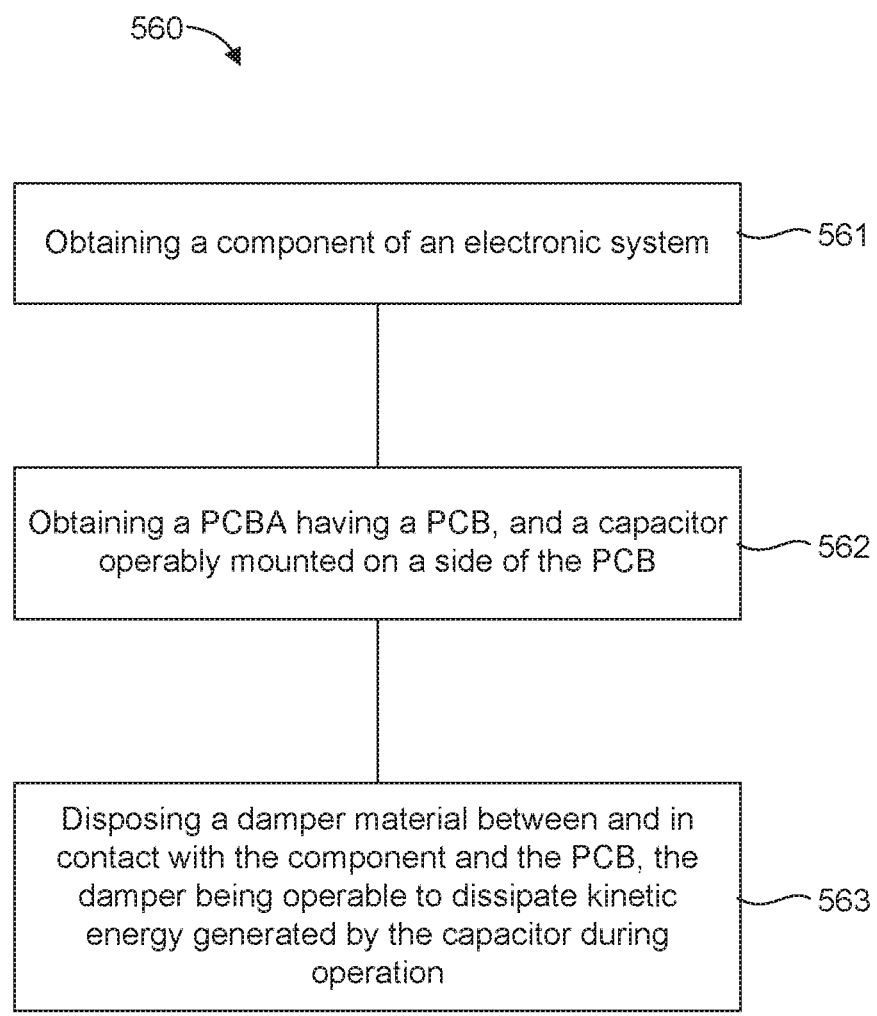
FIG. 7 is a schematic illustration of an exemplary method for minimizing acoustic vibration in an electronic system.

FIG. 7 illustrates aspects of a method 560 for minimizing acoustic vibration in an electronic system. The method can comprise obtaining a component of an electronic system 561, obtaining a PCBA having a PCB, and a capacitor operably mounted on a side of the PCB 562, and disposing a damper material between and in contact with the component and the PCB, the damper being operable to dissipate kinetic energy generated by the capacitor during operation 563.

EXAMPLES

The following examples pertain to further embodiments.

In one example there is provided a PCBA comprising a PCB, a capacitor operably mounted on a side of the PCB, and a damper material coupled to the PCB and operable to dissipate kinetic energy generated by the capacitor during operation.

In one example of a PCBA, the damper material comprises an elastomeric material.

In one example of a PCBA, the damper material is disposed on a second side of the PCB opposite the side on which the capacitor is mounted.

In one example of a PCBA, the damper material covers substantially all of the second side of the PCB.

In one example of a PCBA, the damper material covers only a portion of the second side of the PCB.

In one example of a PCBA, the damper material covers at least an area of the second side of the PCB directly opposite the capacitor.

In one example of a PCBA, the damper material comprises a damper length and a damper width, and the damper length is greater than the damper width.

In one example of a PCBA, the capacitor comprises a capacitor length and a capacitor width, and the capacitor length is greater than the capacitor width, and wherein the damper material is oriented such that the damper length is parallel to the capacitor length.

In one example of a PCBA, the damper material is thermally conductive.

In one example of a PCBA, the damper material has a thermal conductivity greater than or equal to 3 W/(m·K).

In one example of a PCBA, the damper material is electrically insulative.

In one example of a PCBA, the damper material has an electrical resistivity greater than or equal to $10^9$ Ohm·cm.

In one example of a PCBA, the damper material comprises a silicon-based polymer.

In one example of a PCBA, the silicon-based polymer comprises polydimethylsiloxane (PDMS).

In one example of a PCBA, the damper material comprises a filler material selected from the group consisting of boron nitride, aluminum nitride, alumina, magnesia, beryllium oxide, silicon carbide, copper, gold, or a combination thereof.

In one example of a PCBA, the damper material is coupled to the PCB with an adhesive, a fastener, a rivet, or a combination thereof.

In one example of a PCBA, the damper material has a uniform thickness.

In one example of a PCBA, the damper material comprises a sheet configuration.

In one example of a PCBA, the damper material comprises one or more openings configured to receive at least a portion of a protrusion of an adjacent component when installed.

In one example of a PCBA, the one or more openings comprises a blind recess.

In one example of a PCBA, the one or more openings comprises a through hole.

In one example of a PCBA, the damper material has a Shore 00 hardness of 30-60.

In one example of a PCBA, the damper material has a mass density greater than or equal to 2.8 g/cm3.

In one example, a PCBA comprises an acoustic shield disposed about at least a portion of the capacitor.

In one example of a PCBA, the acoustic shield comprises an elastomeric material.

In one example of a PCBA, the acoustic shield is coupled to the PCB.

In one example of a PCBA, the acoustic shield is coupled to the PCB with an adhesive, a fastener, a rivet, or a combination thereof.

In one example of a PCBA, the acoustic shield comprises one or more cavities that receive at least a portion of the capacitor.

In one example of a PCBA, the capacitor comprises a multilayer ceramic capacitor (MLCC).

In one example of a PCBA, the capacitor comprises a plurality of capacitors.

In one example of a PCBA, the capacitor is surface mounted on the PCB.

In one example there is provided an electronic system comprising a component, a PCBA adjacent to the component, the PCBA having a PCB, and a capacitor operably mounted on a side of the PCB, and a damper material disposed between and in contact with the component and the PCB, the damper material being operable to dissipate kinetic energy generated by the capacitor during operation.

In one example of an electronic system, the component comprises a chassis.

In one example of an electronic system, the PCBA is operably coupled to the chassis.

In one example of an electronic system, the component comprises a second PCBA.

In one example of an electronic system, the damper material comprises an elastomeric material.

In one example of an electronic system, the damper material is compressed between the component and the PCB.

In one example of an electronic system, the damper material is compressed at most 30% of an uncompressed thickness of the damper material.

In one example of an electronic system, the damper material is compressed at least 10% of an uncompressed thickness of the damper material.

In one example of an electronic system, the damper material is compressed at most 20% of the uncompressed thickness of the damper material.

In one example of an electronic system, the damper material is disposed proximate a second side of the PCB opposite the side on which the capacitor is mounted.

In one example of an electronic system, the damper material covers substantially all of the second side of the PCB.

In one example of an electronic system, the damper material covers only a portion of the second side of the PCB.

In one example of an electronic system, the damper material covers at least an area of the second side of the PCB directly opposite the capacitor.

In one example of an electronic system, the damper material comprises a damper length and a damper width, and the damper length is greater than the damper width.

In one example of an electronic system, the capacitor comprises a capacitor length and a capacitor width, and the capacitor length is greater than the capacitor width, and wherein the damper material is oriented such that the damper length is parallel to the capacitor length.

In one example of an electronic system, the damper material is thermally conductive.

In one example of an electronic system, the damper material has a thermal conductivity greater than or equal to 3 W/(m·K).

In one example of an electronic system, the damper material is electrically insulative.

In one example of an electronic system, the damper material has an electrical resistivity greater than or equal to $10^9$ Ohm·cm.

In one example of an electronic system, the damper material comprises a silicon-based polymer.

In one example of an electronic system, the silicon-based polymer comprises polydimethylsiloxane (PDMS).

In one example of an electronic system, the damper material comprises a filler material selected from the group consisting of boron nitride, aluminum nitride, alumina, magnesia, beryllium oxide, silicon carbide, copper, gold, or a combination thereof.

In one example of an electronic system, the damper material is coupled to the component, the PCB, or both with an adhesive, a fastener, a rivet, or a combination thereof.

In one example of an electronic system, the damper material has a uniform thickness.

In one example of an electronic system, the damper material comprises a sheet configuration.

In one example of an electronic system, the damper material comprises one or more openings that receive at least a portion of a protrusion of the component.

In one example of an electronic system, the one or more openings comprises a blind recess.

In one example of an electronic system, the one or more openings comprises a through hole.

In one example of an electronic system, the damper material has a Shore 00 hardness of 30-60.

In one example of an electronic system, the damper material has a mass density greater than or equal to 2.8 g/cm3.

In one example, an electronic system comprises an acoustic shield disposed about at least a portion of the capacitor.

In one example of an electronic system, the acoustic shield comprises an elastomeric material.

In one example of an electronic system, the acoustic shield is coupled to the PCB.

In one example of an electronic system, the acoustic shield is coupled to the PCB with an adhesive, a fastener, a rivet, or a combination thereof.

In one example of an electronic system, the acoustic shield comprises one or more cavities that receive at least a portion of the capacitor.

In one example of an electronic system, the capacitor comprises a multilayer ceramic capacitor (MLCC).

In one example of an electronic system, the capacitor comprises a plurality of capacitors.

In one example of an electronic system, the capacitor is surface mounted on the PCB.

In one example of an electronic system, the PCBA further comprises an active electronic component mounted on the PCB.

In one example of an electronic system, the active electronic component comprises a processor, a memory device, or a combination thereof.

In one example of an electronic system, the electronic system comprises a desktop computer, a laptop computer, a tablet, a smartphone, a wearable device, a server, or a combination thereof.

In one example, an electronic system comprises a heat sink, a radio, a slot, a port, or a combination thereof operably coupled to the PCB.

In one example there is provided a method for minimizing acoustic vibration in an electronic system comprising obtaining a component of an electronic system, obtaining a PCBA having a PCB, and a capacitor operably mounted on a side of the PCB, and disposing a damper material between and in contact with the component and the PCB, the damper material being operable to dissipate kinetic energy generated by the capacitor during operation.

In one example of a method for minimizing acoustic vibration in an electronic system, the component comprises a chassis.

In one example of a method for minimizing acoustic vibration in an electronic system, the PCBA is operably coupled to the chassis.

In one example of a method for minimizing acoustic vibration in an electronic system, the component comprises a second PCBA.

In one example of a method for minimizing acoustic vibration in an electronic system, the damper material comprises an elastomeric material.

In one example of a method for minimizing acoustic vibration in an electronic system, disposing the damper material between and in contact with the component and the PCB comprises compressing the damper material between the component and the PCB.

In one example of a method for minimizing acoustic vibration in an electronic system, the damper material is compressed at most 30% of an uncompressed thickness of the damper material.

In one example of a method for minimizing acoustic vibration in an electronic system, the damper material is compressed at least 10% of an uncompressed thickness of the damper material.

In one example of a method for minimizing acoustic vibration in an electronic system, the damper material is compressed at most 20% of the uncompressed thickness of the damper material.

In one example of a method for minimizing acoustic vibration in an electronic system, the damper material is disposed proximate a second side of the PCB opposite the side on which the capacitor is mounted.

In one example of a method for minimizing acoustic vibration in an electronic system, the damper material covers substantially all of the second side of the PCB.

In one example of a method for minimizing acoustic vibration in an electronic system, the damper material covers only a portion of the second side of the PCB.

In one example of a method for minimizing acoustic vibration in an electronic system, the damper material covers at least an area of the second side of the PCB directly opposite the capacitor.

In one example of a method for minimizing acoustic vibration in an electronic system, the damper material comprises a damper length and a damper width, and the damper length is greater than the damper width.

In one example of a method for minimizing acoustic vibration in an electronic system, the capacitor comprises a capacitor length and a capacitor width, and the capacitor length is greater than the capacitor width, and wherein the damper material is oriented such that the damper length is parallel to the capacitor length.

In one example of a method for minimizing acoustic vibration in an electronic system, the damper material is thermally conductive.

In one example of a method for minimizing acoustic vibration in an electronic system, the damper material has a thermal conductivity greater than or equal to 3 W/(m·K).

In one example of a method for minimizing acoustic vibration in an electronic system, the damper material is electrically insulative.

In one example of a method for minimizing acoustic vibration in an electronic system, the damper material has an electrical resistivity greater than or equal to $10^9$ Ohm·cm.

In one example of a method for minimizing acoustic vibration in an electronic system, the damper material comprises a silicon-based polymer.

In one example of a method for minimizing acoustic vibration in an electronic system, the silicon-based polymer comprises polydimethylsiloxane (PDMS).

In one example of a method for minimizing acoustic vibration in an electronic system, the damper material comprises a filler material selected from the group consisting of boron nitride, aluminum nitride, alumina, magnesia, beryllium oxide, silicon carbide, copper, gold, or a combination thereof.

In one example, a method for minimizing acoustic vibration in an electronic system comprises coupling the damper material to the component, the PCB, or both with an adhesive, a fastener, a rivet, or a combination thereof.

In one example of a method for minimizing acoustic vibration in an electronic system, the damper material has a uniform thickness.

In one example of a method for minimizing acoustic vibration in an electronic system, the damper material comprises a sheet configuration.

In one example of a method for minimizing acoustic vibration in an electronic system, the damper material comprises one or more openings that receive at least a portion of a protrusion of the component.

In one example of a method for minimizing acoustic vibration in an electronic system, the one or more openings comprises a blind recess.

In one example of a method for minimizing acoustic vibration in an electronic system, the one or more openings comprises a through hole.

In one example of a method for minimizing acoustic vibration in an electronic system, the damper material has a Shore 00 hardness of 30-60.

In one example of a method for minimizing acoustic vibration in an electronic system, the damper material has a mass density greater than or equal to 2.8 g/cm3.

In one example, a method for minimizing acoustic vibration in an electronic system comprises disposing an acoustic shield about at least a portion of the capacitor.

In one example of a method for minimizing acoustic vibration in an electronic system, the acoustic shield comprises an elastomeric material.

In one example, a method for minimizing acoustic vibration in an electronic system comprises coupling the acoustic shield to the PCB.

In one example of a method for minimizing acoustic vibration in an electronic system, the acoustic shield is coupled to the PCB with an adhesive, a fastener, a rivet, or a combination thereof.

In one example of a method for minimizing acoustic vibration in an electronic system, the acoustic shield comprises one or more cavities that receive at least a portion of the capacitor.

In one example of a method for minimizing acoustic vibration in an electronic system, the capacitor comprises a multilayer ceramic capacitor (MLCC).

In one example of a method for minimizing acoustic vibration in an electronic system, the capacitor comprises a plurality of capacitors.

In one example of a method for minimizing acoustic vibration in an electronic system, the capacitor is surface mounted on the PCB.

In one example of a method for minimizing acoustic vibration in an electronic system, the PCBA further comprises an active electronic component mounted on the PCB.

In one example of a method for minimizing acoustic vibration in an electronic system, the active electronic component comprises a processor, a memory device, or a combination thereof.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A printed circuit board assembly (PCBA), comprising:
   a printed circuit board (PCB);
   a capacitor operably mounted on a side of the PCB, the capacitor being operable to generate kinetic energy during operation that tends to generate an acoustic noise;

a component coupled to the PCB, the component having a protrusion; and a damper material coupled to the PCB and to the component, the damper material operable to dissipate the kinetic energy and minimize the acoustic noise generated by the capacitor during operation, and the damper material over the protrusion of the component, wherein the damper material is disposed only on a second side of the PCB opposite the side on which the capacitor is mounted.

2. The PCBA of claim 1, wherein the damper material has a thermal conductivity greater than or equal to 3 W/(m·K).

3. The PCBA of claim 1, wherein the damper material is electrically insulative.

4. The PCBA of claim 1, wherein the damper material has an electrical resistivity greater than or equal to $10^9$ Ohm·cm.

5. The PCBA of claim 1, wherein the damper material comprises a silicon-based polymer.

6. The PCBA of claim 5, wherein the silicon-based polymer comprises polydimethylsiloxane (PDMS).

7. The PCBA of claim 1, wherein the damper material comprises a filler material selected from the group consisting of boron nitride, aluminum nitride, alumina, magnesia, beryllium oxide, silicon carbide, copper, gold, or a combination thereof.

8. The PCBA of claim 1, wherein the damper material is coupled to the PCB with an adhesive, a fastener, a rivet, or a combination thereof.

9. The PCBA of claim 1, wherein the damper material has a uniform thickness.

10. The PCBA of claim 1, wherein the damper material comprises a sheet configuration.

11. The PCBA of claim 1, wherein the damper material comprises one or more openings.

12. The PCBA of claim 1, wherein the damper material has a Shore 00 hardness of 30-60.

13. The PCBA of claim 1, wherein the damper material has a mass density greater than or equal to 2.8 g/cm$^3$.

14. The PCBA of claim 1, further comprising an acoustic shield disposed about at least a portion of the capacitor.

15. The PCBA of claim 1, wherein the capacitor comprises a multilayer ceramic capacitor (MLCC).

16. The PCBA of claim 1, wherein the capacitor comprises a plurality of capacitors.

17. The PCBA of claim 1, wherein the capacitor is surface mounted on the PCB.

* * * * *